United States Patent
Jackson

[19]

[11] Patent Number: 6,054,908
[45] Date of Patent: Apr. 25, 2000

[54] VARIABLE BANDWIDTH FILTER

[75] Inventor: Charles M. Jackson, Hawthorne, Calif.

[73] Assignee: TRW Inc., Redondo Beach, Calif.

[21] Appl. No.: 08/990,008

[22] Filed: Dec. 12, 1997

[51] Int. Cl.[7] .................................................. H03H 7/12
[52] U.S. Cl. .......................... 333/174; 333/205; 333/207
[58] Field of Search .................................. 333/174, 178, 333/188, 205, 207

[56] References Cited

U.S. PATENT DOCUMENTS

| | | | |
|---|---|---|---|
| 3,229,229 | 1/1966 | Tozzi | 332/141 |
| 3,613,031 | 10/1971 | Pond | 333/188 |
| 3,633,119 | 1/1972 | Balbes | 330/145 X |
| 3,668,478 | 6/1972 | Fabricius | 333/174 X |
| 3,737,801 | 6/1973 | Adams et al. | 337/53 |
| 3,858,127 | 12/1974 | Johnson | 333/188 |
| 4,060,776 | 11/1977 | Blinchikoff | 333/188 |
| 4,323,866 | 4/1982 | Inoue | 333/188 |
| 4,338,582 | 7/1982 | Presser | 333/175 |
| 4,433,315 | 2/1984 | Vandergraaf | 333/174 |
| 4,710,702 | 12/1987 | Itaya et al. | 324/76.45 |
| 4,731,877 | 3/1988 | Moon | 455/340 |
| 4,737,744 | 4/1988 | Hayward et al. | 333/168 |
| 4,989,264 | 1/1991 | Ohto | 333/178 X |
| 5,150,085 | 9/1992 | Hales | 333/174 |
| 5,175,521 | 12/1992 | Larson | 333/235 |
| 5,291,159 | 3/1994 | Vale | 333/174 X |
| 5,376,907 | 12/1994 | Duflot et al. | 333/174 |
| 5,379,008 | 1/1995 | Bockelman et al. | 333/174 |
| 5,392,011 | 2/1995 | Li | 333/174 |
| 5,444,600 | 8/1995 | Dobkin et al. | 361/303 |
| 5,541,558 | 7/1996 | Weber et al. | 333/174 |

FOREIGN PATENT DOCUMENTS

| | | | |
|---|---|---|---|
| 647060 | 6/1937 | Germany | 333/174 |
| 61-135214 | 6/1986 | Japan | 333/174 |

*Primary Examiner*—Justin P. Bettendorf
*Attorney, Agent, or Firm*—Michael S. Yatsko

[57] ABSTRACT

A variable bandwidth filter that includes either a parallel or series combination of a fixed impedance, such as a capacitor, and a variable impedance, such as a variable capacitor. The series and parallel combinations enable the ideal capacitance values for the filter coupling to be approximated thereby enabling a single control voltage to control the filter bandwidth without effecting the filter's upper frequency.

15 Claims, 3 Drawing Sheets

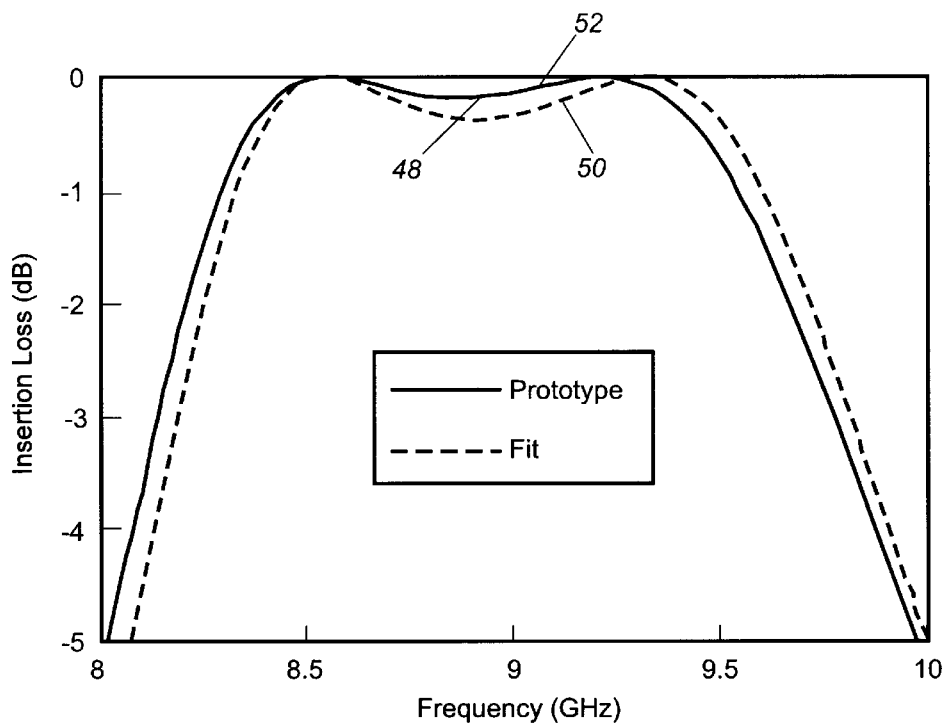
Figure 4
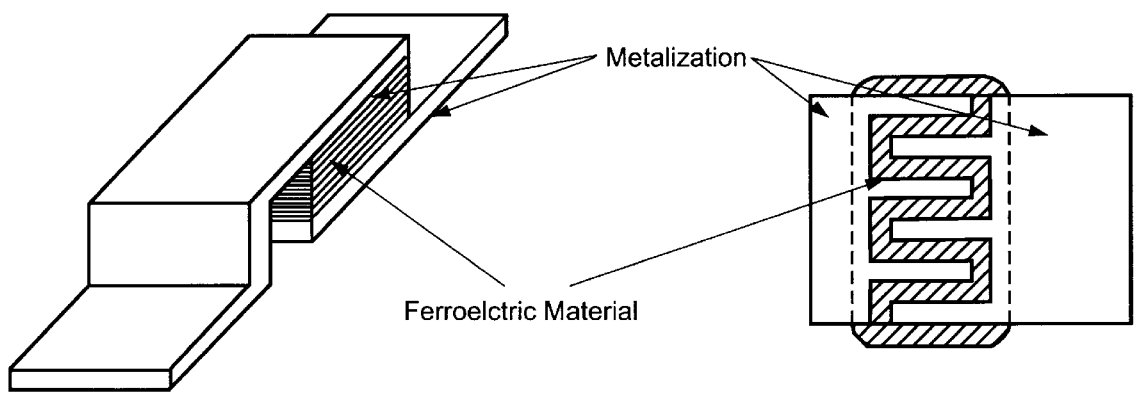
Figure 5a
Figure 5b

VARIABLE BANDWIDTH FILTER

BACKGROUND OF THE INVENTION

1. Field of the Invention

The present invention relates to a variable bandwidth filter and more particularly to a variable bandwidth filter that includes either a parallel or series combination of a fixed impedance, such as a capacitor, and variable impedance, such as a variable capacitor, which enable ideal capacitance values for the filter to be approximated thereby enabling a single control voltage to control the filter bandwidth.

2. Description of the Prior Art

Variable bandwidth filters are known in the art. Examples of such variable bandwidth filters are disclosed in U.S. Pat. Nos. 3,633,119 and 5,541,558. Such variable bandwidth filters are used in a wide variety of application including radar, communication and remote sensing.

U.S. Pat. No. 3,633,119 discloses a multi-stage intermediate frequency amplifier. The stages of the multi-stage amplifier are coupled together by interstage coupling filters. Each interstage filter includes two resonant circuits that are capacitively coupled by a T network forming two series legs and one shunt leg connected at a junction. Each leg of the T network includes a varactor diode. A control voltage applied to the junction raises the effective capacitance of the series leg while lowering the capacitance of the shunt leg thereby varying the bandwidth of the filter. Unfortunately, under certain conditions, varying the control voltage in order to the vary the bandwidth can cause the center frequency of the filter to shift. Shifting of the center frequency can be highly undesirable.

U.S. Pat. No. 5,541,558 discloses a wideband bandpass filter in which the center frequency and bandwidth are variable. The wideband bandpass filter includes a tank circuit coupled between an input and output tapping circuit. The tank circuit includes a variable capacitor and an inductor in parallel. The tank circuit determines the center frequency for the bandpass filter. The input and output tapping circuits each include variable impedance devices. The input and output variable impedance determine the bandwidth of the filter. A problem with such a circuit is that the variable elements must be tuned separately because of the interdependence of the various elements forming the filter. As such, multiple control lines are required for each of the variable impedance devices which greatly increases the complexity as well as the cost of the circuitry.

SUMMARY OF THE INVENTION

It is an object of the present invention to solve various problems in the prior art.

It is yet another object of the present invention to provide a variable bandwidth filter in which the bandwidth can be controlled by a single control voltage.

It is a further object of the present invention to provide a variable bandwidth filter in which the adjustment of the bandwidth does not effect the upper frequency of the filter.

Briefly, the present invention relates to a variable bandwidth filter that includes either a parallel or series combination of a fixed impedance, such as a capacitor, and a variable impedance, such as a variable capacitor. The series and parallel combinations enable the ideal capacitances values for the filter to be approximated, thereby enabling a single control voltage to control the filter bandwidth without affecting the upper frequency of the filter.

DESCRIPTION OF THE DRAWINGS

These and other objects of the present invention will be readily understood with reference to the following specification and attached drawing, wherein:

FIG. 4 is a graphical illustration of the filter response in terms of insertion loss at an intermediate bandwidth for both the exemplary circuit illustrated in FIG. 1A at the ideal values and an approximate response for the intermediate bandwidth where the capacitor element fit is not optimal.

FIG. 5A is a perspective view with a parallel plate variable capacitor for use in the variable bandwidth filter in accordance with the present invention.

FIG. 5B is a plane view of an interdigitated variable capacitor for use with the variable bandwidth filter in accordance with the present invention.

DETAILED DESCRIPTION

Figure 1A:
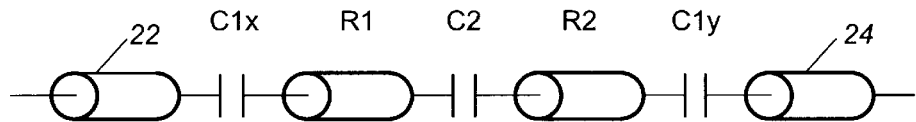
FIG. 1A is a schematic diagram of an exemplary filter prototype.
Figure 1B:
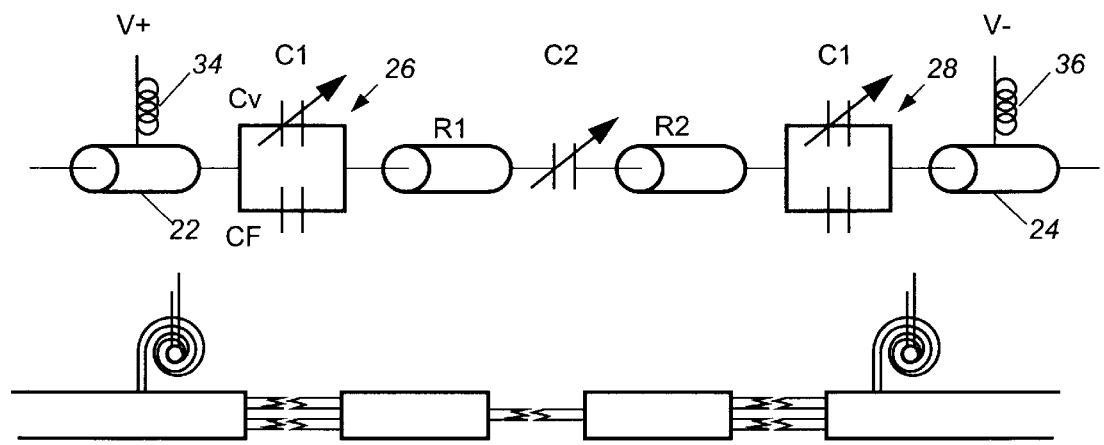
FIG. 1B is a schematic diagram of the exemplary filter prototype illustrated in FIG. 1A incorporating a parallel combination of variable and fixed capacitors in accordance with one embodiment of the invention to enable a single bias voltage to used to tune a variable bandwidth filter.

An exemplary filter prototype is illustrated in FIG. 1A and generally identified with the reference numeral 20. The filter prototype 20 includes two resonators R1 and R2 and three capacitors C1X, C1Y and C2. The capacitor C2 is coupled between the two resonators R1 and R2 and acts as an inner coupling capacitor. The capacitors C1X and C1Y are outer coupling capacitors and are connected between the resonators R1 and R2 and input and output resistors 22 and 24.

As disclosed in detail "MICROWAVE FILTERS, IMPEDANCE-MATCHING NETWORKS, AND COUPLING STRUCTURES, by Mattaei et al, Artech House Books, Dedham Mass. (1964) hereby incorporated by reference, the capacitance values for the outer coupling capacitors C1X and C1Y vary as a function of a square root of the bandwidth as generally illustrated in Equation (1).

$$\frac{J_{01}}{Y_0} = \sqrt{\frac{\pi \delta}{\partial \omega_0 g_0 g_1}}, \text{ where} \qquad 1$$

$J_{01}$=is the coupling value $Y_0$=is the characteristic admittance, $\delta$=is the normalized bandwidth, $\omega_0$, is the frequency, $g_0$ is the transconductance of the capacitor of C1X, $g_1$ is the transconductance of the capacitor C1Y.

Unfortunately, the capacitance value of the inner coupling capacitor C2 varies linearly with the bandwidth as generally given with Equation (2).

$$\frac{J_{j,j+1}}{Y_0} = \frac{\pi \delta_1}{2w_1} \sqrt{g_j \cdot g_{j+1}} \text{ where,} \qquad 2$$

$J_{j,j+1}$=is the coupling value, $g_j$=is the jth normalized impedance and $g_{j+1}$=is the (j+1)th normalized impedance, $Y_0$=is the characteristic admittance and $\omega$=is the normalized bandwidth. Because of these characteristics, the inner coupling capacitor C2 and the outer coupling capacitors C1X and C1Y must tuned differently.

Figure 1C:
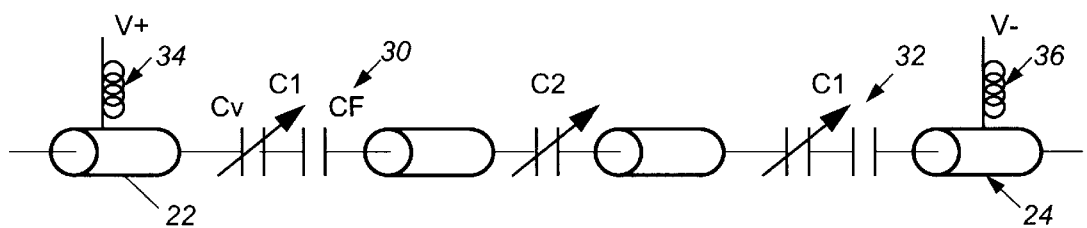
FIG. 1C is similar to 1B but illustrates a series combination of the variable and fixed capacitor in accordance with an alternate embodiment of the invention.
Figure 2:
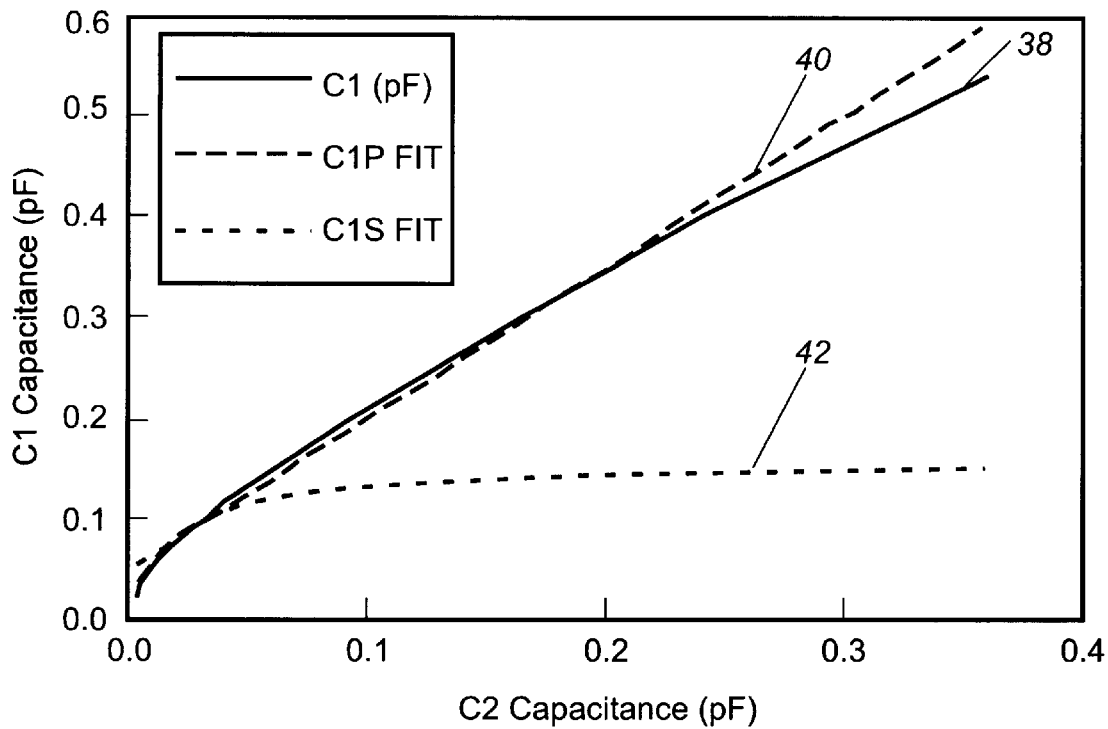
FIG. 2 is a graphical illustration illustrating ideal capacitance values for the exemplary filter illustrated in 1A shown in solid line with the narrowband and broadband fits to the ideal values for both the series and parallel implementations in accordance with the present invention.

In accordance with one embodiment of the present invention, the outer coupling capacitors C1X and C1Y are replaced with a parallel combination, generally identified with the reference numerals 26 and 28, of a variable impedance, such as a variable capacitor $C_v$, and a fixed impedance, such as a capacitor $C_f$. In an alternate embodiment of the invention as illustrated in FIG. 1C, series combinations, generally identified with the reference numerals 30 and 32, of a variable impedance, such as a capacitor variable $C_v$ and a serially coupled fixed impedance, such as capacitor $C_f$, are substituted for the outer coupling capacitors C1X and C1Y. As illustrated in FIG. 2, a single bias voltage V+, V− may be applied across the resistances 22 and 24 by way of series inductances 34 and 36.

Referring to FIG. 2, ideal capacitance values for the exemplary filter prototype 20 illustrated in FIG. 1A are shown by the solid line 38. As mentioned above, the inner coupling capacitor C2 varies linearly with the bandwidth while the outer capacitors C1X and C1Y vary with the square root of the bandwidth. As shown by the dotted line 40, the parallel combination 26, 28 of the fixed capacitor $C_f$ and the variable capacitor $C_v$, approximates the ideal capacitor values over a relatively broadband. The line 42 illustrates that the series combinations 30, 32 of the variable capacitor $C_v$ and the fixed capacitor $C_f$ approximate the ideal capacitor values over a relatively narrowband.

Figure 3:
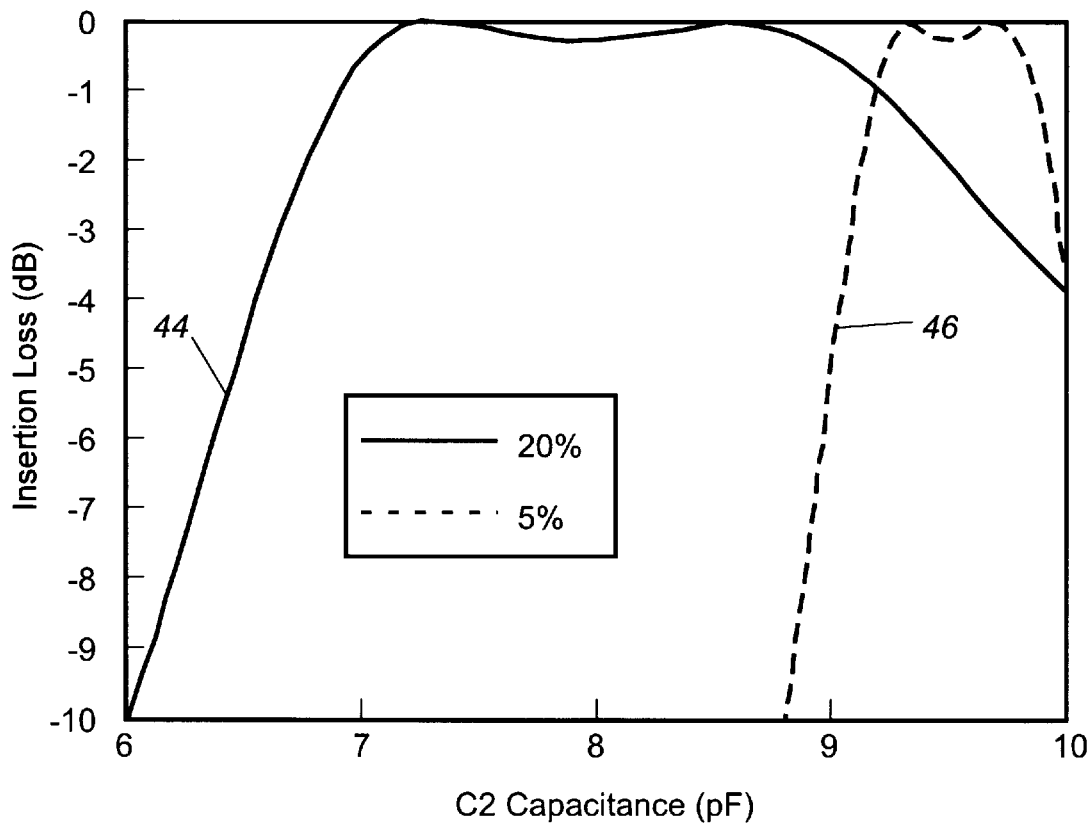
FIG. 3 is a graphical illustration illustrating the filter response in terms of insertion loss for the exemplary filter illustrated in FIG. 1A at the minimum and maximum bandwidths.

FIG. 3 represents the filter response of the filter in terms of insertion loss in db as a function of frequency in GHz for the exemplary filter illustrated in FIG. 1A. The solid line 44 represents a maximum 20% bandwidth while the dotted line 46 illustrates a minimum 5% bandwidth. FIG. 4 illustrates the frequency response of the filter illustrated in FIG. 1A at an intermediate bandwidth. In particular, the solid line 48 illustrates the filter response at a 10% bandwidth utilizing the ideal filter capacitor values as illustrated in FIG. 2. The line 50 illustrates an approximated response for an intermediate bandwidth in which the capacitor element fit is not ideal. An important aspect of the invention is that the increase in ripple (i.e. difference between 48 and 50 in the area identified with the reference numeral 52) is only minimally affected.

The exemplary filter prototype illustrated in FIG. 1A is a bandpass filter. However, it should be appreciated by those of ordinary skill in the art, that the principles of the present invention are applicable to various other filters topologies such as lowpass and highpass topologies. Moreover, the filter is illustrated and described with lumped components. The principles of the present invention are also applicable to filters, such as microstrip filters, which include various distributed components as well.

Various types of resonators are suitable for use with the present invention.

For example, the resonators $R_1$ and $R_2$ may implemented in coax, microstrip, stripline, CPW and other media. Moreover, various of variable capacitors are suitable for use with the present invention. For example, a parallel plate capacitor as illustrated in FIG. 5a or an interdigitated capacitor as illustrated in FIG. 5b may be used. Such parallel plate variable —capacitors are commonly known. The parallel plate capacitor is preferably formed from a ferroelectric material. Interdigitated parallel plate capacitors are described in detail in *IEEE Transactions an Microwave Theory and Techniques*, Vol. 4, pp. 156–160, 1994, hereby incorporated by reference. Exemplary values for the capacitors $C_1$ and $C_2$ are illustrated in terms of the total capacitance $C_1$, which, as discussed above, is formed from either a series or parallel combination of a fixed capacitance and a variable capacitance.

Obviously, many modifications and variations of the present invention are possible in light of the above teachings. Thus, it is to be understood that, within the scope of the appended claims, the invention may be practiced otherwise than as specifically described above.

What is desired to be claimed by a Letters Patent is:

1. A variable bandwidth filter comprising:
   an input;
   an output;
   a pair of resonators;
   at least one first outer coupling impedance, electrically coupled between said input and one of said pair of resonators;
   at least one second outer coupling impedance, electrically coupled between said output and the other of said pair of resonators, and
   an inner coupling impedance, serially coupled between said pair of resonators, wherein at least one of said first and second outer coupling impedances includes a fixed impedance element and a variable impedance element.

2. The variable bandwidth filter as recited in claim 1, wherein said variable impedance element and said fixed impedance element forming said first coupling impedance are connected in parallel.

3. The variable bandwidth filter as recited in claim 2, wherein said said variable impedance element and said fixed impedance element forming said second outer coupling impedance are connected in parallel.

4. The variable bandwidth filter as recited in claim 1, wherein said first outer coupling impedance includes a fixed capacitor.

5. The variable bandwidth filter as recited in claim 4, wherein said first outer coupling impedance includes a variable capacitor.

6. The variable bandwidth filter are recited in claim 5, wherein said second outer coupling impedance includes a fixed capacitor.

7. The variable bandwidth filter as recited in claim 6, wherein said second outer coupling impedance includes a variable capacitor.

8. The variable bandwidth filter as recited in claim 7, wherein second outer coupling impedance includes a fixed capacitor.

9. The variable bandwidth filter as recited in claim 1, wherein said variable impedance element and said fixed impedance element forming said first outer coupling said impedance are coupled in series.

10. The variable bandwidth filter as recited in claim 9, wherein said fixed impedance element and said variable impedance element forming said second outer coupling impedance are coupled in series.

11. The variable bandwidth filter as recited in claim 9, wherein at least one of said fixed and said variable impedance elements includes a capacitor.

12. The variable bandwidth filter as recited in claim 11, wherein the other of said fixed and variable impedance elements includes a capacitor.

13. The variable bandwidth filter as recited in claim 1, wherein said filter is a bandpass filter.

14. A variable bandwidth filter comprising;

an input;

a pair of resonators;

an inner coupling capacitor coupled between said pair of resonators;

a pair of outer coupling capacitor circuits, coupled between said input and said output and said pair of resonators, wherein said outer coupling capacitor circuits are each formed from a parallel combination of a fixed capacitor and a variable capacitor, which enable the bandwidth of the filter to be varied electronically by a single control voltage.

15. A variable bandwidth filter comprising:

an input;

an output;

a pair of resonators;

an inner coupling capacitor coupled between said pair of resonators;

a pair of outer coupling capacitor circuits, coupled between input and said output and said pair of resonators, wherein said outer coupling capacitor circuits are each formed from a series combination of a fixed capacitor and a variable capacitor which enable the bandwidth of the filter to be varied electronically by a single control voltage.

* * * * *